(12) United States Patent
Kumai

(10) Patent No.: US 12,719,241 B2
(45) Date of Patent: Aug. 25, 2026

(54) PROCESSING HEAD AND LASER PROCESSING APPARATUS

(71) Applicant: SEIKO EPSON CORPORATION, Tokyo (JP)

(72) Inventor: Yoshitomo Kumai, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 724 days.

(21) Appl. No.: 18/186,959

(22) Filed: Mar. 21, 2023

(65) Prior Publication Data

US 2023/0307892 A1 Sep. 28, 2023

(30) Foreign Application Priority Data

Mar. 24, 2022 (JP) ................................ 2022-048266

(51) Int. Cl.

*H01S 5/42* (2006.01)
*H01S 5/11* (2021.01)
*B23K 26/06* (2014.01)

(52) U.S. Cl.

CPC .................. *H01S 5/42* (2013.01); *H01S 5/11* (2021.01); *B23K 26/0604* (2013.01)

(58) Field of Classification Search

CPC ............... H01S 5/11; H01S 5/42; H01S 5/423
See application file for complete search history.

(56) References Cited

U.S. PATENT DOCUMENTS

| | | | | |
|---|---|---|---|---|
| 6,894,712 B2 * | 5/2005 | Ishikawa | B41J 2/47 347/255 |
| 2005/0151828 A1 * | 7/2005 | Maeda | B41J 2/451 347/238 |
| 2005/0158902 A1 * | 7/2005 | Chua | B82Y 20/00 438/32 |
| 2007/0296803 A1 | 12/2007 | Ohno et al. | |

(Continued)

FOREIGN PATENT DOCUMENTS

| | | |
|---|---|---|
| JP | 2002144627 | 5/2002 |
| JP | 2007253451 | 10/2007 |

(Continued)

OTHER PUBLICATIONS

Noda et al., Photonic-Crystal Surface-Emitting Lasers: Review and Introduction of Modulated-Photonic Crystals, IEEE Journal of Selected Topics in Quantum Electronics, vol. 23 No. 6 (Year: 2017).*

(Continued)

*Primary Examiner* — James A Menefee
(74) *Attorney, Agent, or Firm* — JCIPRNET

(57) ABSTRACT

A processing head including a first laser array element in which a plurality of first photonic crystal lasers are arranged in a first direction, and a second laser array element in which a plurality of second photonic crystal lasers are arranged in the first direction, the first laser array element and the second laser array element emit laser light in a third direction intersecting the first direction and a second direction to a processing target object while being relatively moved with (Continued)

respect to the processing target object in the second direction intersecting the first direction, and when viewed from the second direction, the second end photonic crystal laser and the second intermediate photonic crystal laser overlap each other.

9 Claims, 9 Drawing Sheets

(56) References Cited

U.S. PATENT DOCUMENTS

| | | | | |
|---|---|---|---|---|
| 2008/0180759 | A1* | 7/2008 | Nomura | B41J 2/451 358/494 |
| 2009/0303308 | A1* | 12/2009 | Itoh | H01S 5/18394 347/256 |
| 2010/0220763 | A1 | 9/2010 | Ikuta | |
| 2012/0106585 | A1* | 5/2012 | Wang | H01S 5/423 438/34 |
| 2012/0128015 | A1* | 5/2012 | Joseph | H01S 3/09415 372/75 |
| 2014/0124490 | A1* | 5/2014 | Bangel | B31B 50/16 219/121.72 |
| 2015/0362585 | A1* | 12/2015 | Ghosh | G01S 17/10 250/208.1 |
| 2017/0353012 | A1* | 12/2017 | Barve | H01S 5/423 |
| 2018/0348451 | A1 | 12/2018 | Yamamoto et al. | |
| 2021/0320478 | A1* | 10/2021 | Van Leeuwen | H01S 5/4018 |
| 2022/0171307 | A1 | 6/2022 | Kamata | |

FOREIGN PATENT DOCUMENTS

| | | |
|---|---|---|
| JP | 2009212359 | 9/2009 |
| JP | 2010093127 | 4/2010 |
| JP | 2014184622 | 10/2014 |
| JP | 2018056148 | 4/2018 |
| JP | 2020097198 | 6/2020 |
| JP | 2021030563 | 3/2021 |
| JP | 2021154714 | 10/2021 |
| WO | 2016189983 | 12/2016 |

OTHER PUBLICATIONS

Homepage of Laser Concierge, Inc "Laser Optics > F-Theta Lens for Galvano Scanner", https://www.laser-concierge.com/productsearch/optics/sei/scanner_ft/co2.php, pp. 1-5.

* cited by examiner

PROCESSING HEAD AND LASER PROCESSING APPARATUS

The present application is based on, and claims priority from JP Application Serial Number 2022-048266, filed Mar. 24, 2022, the disclosure of which is hereby incorporated by reference herein in its entirety.

BACKGROUND

1. Technical Field

The present disclosure relates to a processing head and a laser processing apparatus.

2. Related Art

A photonic crystal surface emitting laser (PCSEL) utilizing a photonic crystal effect is known. The PCSEL is applied to, for example, a processing head of a laser processing apparatus that irradiates a processing target object with laser light.

For example, JP-A-2018-56148 discloses a laser module provided with a plurality of the PCSELs. The PCSEL includes a substrate and a photonic crystal layer stacked on the substrate. The photonic crystal layer is fabricated by etching a slab layer to form a hole.

In the processing head provided with the plurality of PCSELs as described above, the PCSELs provided in a peripheral portion of the substrate have difficulty in having desired characteristics, such that, for example, an oscillation wavelength deviates. For example, when warpage occurs in the substrate on which the photonic crystal layer is stacked, an etching amount is larger in the peripheral portion of the slab layer than in the central portion of the slab layer, and a hole having a desired diameter cannot be formed. Thus, the PCSEL having the desired characteristics cannot be formed in the peripheral portion. When the PCSEL having the desired characteristics cannot be formed, the processing accuracy of the processing head decreases.

SUMMARY

One aspect of a processing head according to the present disclosure includes a first laser array element in which a plurality of first photonic crystal lasers are arranged in a first direction, a second laser array element in which a plurality of second photonic crystal lasers are arranged in the first direction, wherein the first laser array element and the second laser array element emit laser light in a third direction intersecting the first direction and a second direction to a processing target object while being relatively moved with respect to the processing target object in the second direction intersecting the first direction, a first end photonic crystal laser among the plurality of first photonic crystal lasers is located furthest in an opposite direction from the first direction among the plurality of first photonic crystal lasers, a second end photonic crystal laser among the plurality of first photonic crystal lasers is located furthest in the first direction among the plurality of first photonic crystal lasers, a first intermediate photonic crystal laser among the plurality of first photonic crystal lasers is located between the first end photonic crystal laser and the second end photonic crystal laser, a third end photonic crystal laser among the plurality of second photonic crystal lasers is located furthest in the opposite direction among the plurality of second photonic crystal lasers, a fourth end photonic crystal laser among the plurality of second photonic crystal lasers is located furthest in the first direction among the plurality of second photonic crystal lasers, a second intermediate photonic crystal laser among the plurality of second photonic crystal lasers is located between the third end photonic crystal laser and the fourth end photonic crystal laser, and when viewed from the second direction, the second end photonic crystal laser and the second intermediate photonic crystal laser overlap each other.

One aspect of a laser processing apparatus according to the present disclosure includes one aspect of the above-described processing head.

DESCRIPTION OF EXEMPLARY EMBODIMENTS

Preferred exemplary embodiments of the present disclosure will be described in detail with reference to accompanying drawings hereinafter. Note that the exemplary embodiment described hereinafter is not intended to unjustly limit the content of the present disclosure as set forth in the claims. In addition, all of the configurations described hereinafter are not necessarily essential constituent requirements of the present disclosure.

1. First Embodiment

1.1. Processing Head

Figure 1:
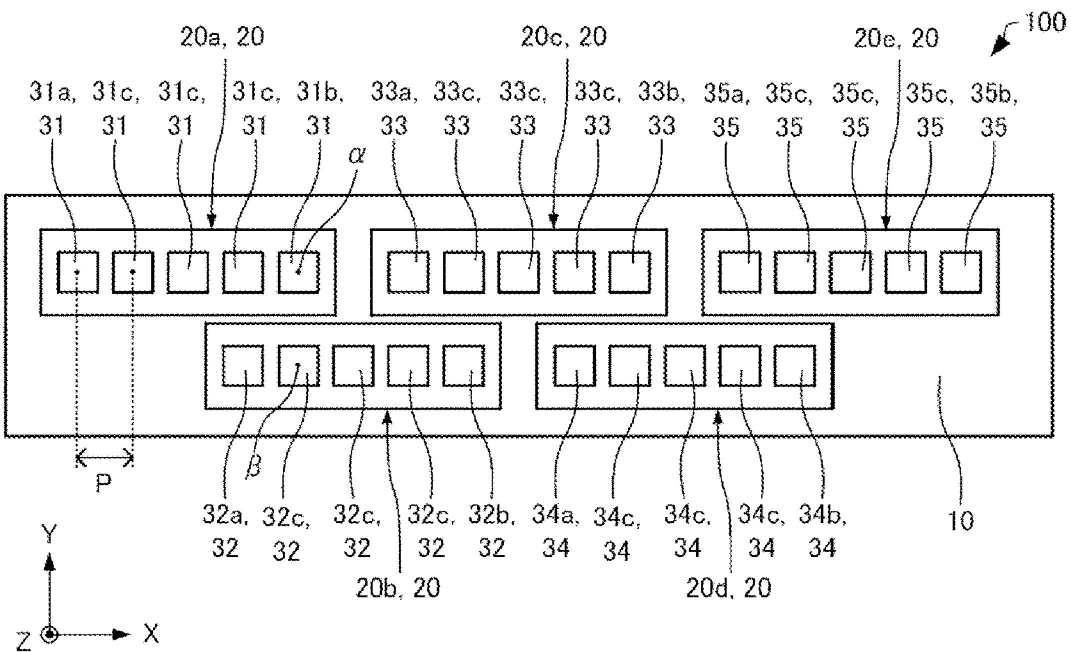
FIG. 1 is a plan view schematically illustrating a processing head according to a first embodiment.

First, a processing head according to a first embodiment will be described with reference to the accompanying drawings. FIG. 1 is a plan view schematically illustrating a processing head 100 according to the first embodiment. Note that, an x-axis, a y-axis, and a z-axis are illustrated in FIG. 1 as three axes orthogonal to each other.

As illustrated in FIG. 1, the processing head 100 includes, for example, a substrate 10 and laser array elements 20.

The substrate 10 supports the laser array elements 20. A material of the substrate 10 is not particularly limited.

The laser array elements 20 are provided at the substrate 10. The laser array elements 20 are bonded to, for example, the substrate 10. In the illustrated example, a planar shape of the laser array element 20 is a rectangle including long sides parallel to the X-axis.

The laser array elements 20 are relatively moved with respect to a processing target object (not illustrated) in a second direction intersecting a first direction. The laser array elements 20 may be moved in a state where the processing target object is fixed, or the processing target object may be moved in a state where the laser array elements 20 are fixed. The laser array elements 20 are moved with, for example, the substrate 10. The laser array elements 20 and the substrate 10 are moved by a moving mechanism (not illustrated).

The laser array elements 20 irradiates the processing target object with laser light in a third direction intersecting the first direction and the second direction while being relatively moved with respect to the processing target object. The first direction, the second direction, and the third direction are, for example, directions orthogonal to each other. In the illustrated example, the first direction is a +X-axis direction. The second direction is a +Y-axis direction. The third direction is a +Z-axis direction.

A plurality of the laser array elements 20 are provided. The number of the laser array elements 20 is not particularly limited as long as there are the plurality of laser array elements 20. In the illustrated example, five laser array elements 20 are provided as a first laser array element 20*a*, a second laser array element 20*b*, a third laser array element 20*c*, a fourth laser array element 20*d*, and a fifth laser array element 20*e*.

The first laser array element 20*a*, the third laser array element 20*c*, and the fifth laser array element 20*e* are arranged in the +X-axis direction. The third laser array element 20*c* is provided between the first laser array element 20*a* and the fifth laser array element 20*e*. In the illustrated example, the third laser array element 20*c* is provided in the +X-axis direction of the first laser array element 20*a*. A distance between the first laser array element 20*a* and the third laser array element 20*c* and a distance between the third laser array element 20*c* and the fifth laser array element 20*e* are, for example, the same.

The second laser array element 20*b* and the fourth laser array element 20*d* are arranged in the +X-axis direction. In the illustrated example, the fourth laser array element 20*d* is provided in the +X-axis direction of the second laser array element 20*b*. A distance between the second laser array element 20*b* and the fourth laser array element 20*d* and a distance between the first laser array element 20*a* and the third laser array element 20*c* are, for example, the same.

The second laser array element 20*b* is provided in the −Y-axis direction of the laser array elements 20*a* and 20*c*. The fourth laser array element 20*d* is provided in the −Y-axis direction of the laser array elements 20*c* and 20*e*.

The first laser array element 20*a* includes a plurality of first photonic crystal lasers 31. The second laser array element 20*b* includes a plurality of second photonic crystal lasers 32. The third laser array element 20*c* includes a plurality of third photonic crystal lasers 33. The fourth laser array element 20*d* includes a plurality of fourth photonic crystal lasers 34. The fifth laser array element 20*e* includes a plurality of fifth photonic crystal lasers 35. The photonic crystal lasers 31, 32, 33, 34, and 35 are PCSELs. Hereinafter, the "photonic crystal laser" is also referred to as the "PCSEL".

The planar shapes of the PCSELs 31, 32, 33, 34, and 35 are, for example, square. The sizes of the PCSELs 31, 32, 33, 34, and 35 are, for example, the same as each other when viewed from the Z-axis direction.

A plurality of the first PCSELs 31 are provided. The number of the first PCSELs 31 is not particularly limited as long as three or more first PCSELs 31 are provided. In the illustrated example, five first PCSELs 31 are provided. Similarly, a plurality of each of the PCSELs 32, 33, 34, and 35 are provided.

The plurality of first PCSELs 31 are arranged at a first pitch P in the X-axis direction. The plurality of first PCSELs 31 are linearly arranged. Note that the "first pitch P" is a distance between centers of the first PCSELs 31 adjacent to each other in the X-axis direction. When the planar shape of the first PCSEL 31 is a circle, the "center of the first PCSEL 31" is a center of the circle, and when the planar shape of the first PCSEL 31 is a shape other than the circle, the "center of the first PCSEL 31" is a center of the minimum inclusion circle. For example, when the planar shape of the first PCSEL 31 is a polygon, the center of the first PCSEL 31 is the center of the smallest circle including the polygon therein, and when the planar shape of the first PCSEL 31 is an ellipse, the center of the first PCSEL 31 is the center of the smallest circle including the ellipse therein.

Similarly, the plurality of the second PCSELs 32, the plurality of the third PCSELs 33, the plurality of the fourth PCSELs 34, and the plurality of the fifth PCSELs 35 are arranged at the first pitch P in the X-axis direction. The plurality of second PCSELs 32 are linearly arranged. The plurality of third PCSELs 33 are linearly arranged. The plurality of fourth PCSELs 34 are linearly arranged. The plurality of fifth PCSELs 35 are linearly arranged.

A first end PCSEL 31*a* among the plurality of first PCSELs 31 is located in the most −X-axis direction among the plurality of first PCSELs 31. A second end PCSEL 31*b* among the plurality of first PCSELs 31 is located in the most +X-axis direction among the plurality of first PCSELs 31. A first intermediate PCSEL 31*c* among the plurality of first PCSELs 31 is located between the first end PCSEL 31*a* and the second end PCSEL 31*b*. In the illustrated example, three first intermediate PCSELs 31*c* are provided.

A third end PCSEL 32*a* among the plurality of second PCSELs 32 is located in the most −X-axis direction among the plurality of second PCSELs 32. A fourth end PCSEL 32*b* among the plurality of second PCSELs 32 is located in the most +X-axis direction among the plurality of second PCSELs 32. A second intermediate PCSEL 32*c* among the plurality of second PCSELs 32 is located between the third end PCSEL 32*a* and the fourth end PCSEL 32*b*. In the illustrated example, three second intermediate PCSELs 32*c* are provided.

A fifth end PCSEL 33*a* among the plurality of third PCSELs 33 is located in the most −X-axis direction among the plurality of third PCSELs 33. A sixth end PCSEL 33*b* among the plurality of third PCSELs 33 is located in the most +X-axis direction among the plurality of third PCSELs 33. A third intermediate PCSEL 33*c* among the plurality of third PCSELs 33 is located between the fifth end PCSEL 33*a* and the sixth end PCSEL 33*b*. In the illustrated example, three third intermediate PCSELs 33*c* are provided.

A seventh end PCSEL 34*a* among the plurality of fourth PCSELs 34 is located in the most −X-axis direction among the plurality of fourth PCSELs 34. An eighth end PCSEL 34*b* among the plurality of fourth PCSELs 34 is located in the most +X-axis direction among the plurality of fourth PCSELs 34. A fourth intermediate PCSEL 34*c* among the plurality of fourth PCSELs 34 is located between the seventh end PCSEL 34*a* and the eighth end PCSEL 34*b*. In the illustrated example, three fourth intermediate PCSELs 34*c* are provided.

A ninth end PCSEL 35*a* among the plurality of fifth PCSELs 35 is located in the most −X-axis direction among the plurality of fifth PCSELs 35. A tenth end PCSEL 35*b* among the plurality of fifth PCSELs 35 is located in the most +X-axis direction among the plurality of fifth PCSELs 35. A fifth intermediate PCSEL 35*c* among the plurality of fifth PCSELs 35 is located between the ninth end PCSEL 35*a* and the tenth end PCSEL 35*b*. In the illustrated example, three fifth intermediate PCSELs 35*c* are provided.

When viewed from the +Y-axis direction, the second end PCSEL 31*b* and the second intermediate PCSEL 32*c* overlap each other. In the illustrated example, the second end PCSEL 31*b* and the second intermediate PCSEL 32*c* located in the most −X-axis direction among the plurality of second intermediate PCSELs 32*c* overlap each other.

When viewed from the +Y-axis direction, the third end PCSEL 32*a* and the first intermediate PCSEL 31*c* overlap each other. In the illustrated example, the third end PCSEL 32*a* and the first intermediate PCSEL 31*c* located in the most +X-axis direction among the plurality of first intermediate PCSELs 31*c* overlap each other.

When viewed from the +Y-axis direction, the fourth end PCSEL 32*b* and the third intermediate PCSEL 33*c* overlap each other. In the illustrated example, the fourth end PCSEL 32*b* and the third intermediate PCSEL 33*c* located in the most −X-axis direction among the plurality of third intermediate PCSELs 33*c* overlap each other.

When viewed from the +Y-axis direction, the fifth end PCSEL 33*a* and the second intermediate PCSEL 32*c* overlap each other. In the illustrated example, the fifth end PCSEL 33*a* and the second intermediate PCSEL 32*c* located in the most +X-axis direction among the plurality of second intermediate PCSELs 32*c* overlap each other.

When viewed from the +Y-axis direction, the sixth end PCSEL 33*b* and the fourth intermediate PCSEL 34*c* overlap each other. In the illustrated example, the sixth end PCSEL 33*b* and the fourth intermediate PCSEL 34*c* located in the most −X-axis direction among the plurality of fourth intermediate PCSELs 34*c* overlap each other.

When viewed from the +Y-axis direction, the seventh end PCSEL 34*a* and the third intermediate PCSEL 33*c* overlap each other. In the illustrated example, the seventh end PCSEL 34*a* and the third intermediate PCSEL 33*c* located on the most +X-axis direction among the plurality of third intermediate PCSELs 33*c* overlap each other.

When viewed from the +Y-axis direction, the eighth end PCSEL 34*b* and the fifth intermediate PCSEL 35*c* overlap each other. In the illustrated example, the eighth end PCSEL 34*b* and the fifth intermediate PCSEL 35*c* located in the most −X-axis direction among the plurality of fifth intermediate PCSELs 35*c* overlap each other.

When viewed from the +Y-axis direction, the ninth end PCSEL 35*a* and the fourth intermediate PCSEL 34*c* overlap each other. In the illustrated example, the ninth end PCSEL 35*a* and the fourth intermediate PCSEL 34*c* located in the most −X-axis direction among the plurality of fourth intermediate PCSELs 34*c* overlap each other.

When viewed from the Y-axis direction, a center α of the second end PCSEL 31*b* and a center β of the second intermediate PCSEL 32*c* overlap each other. As described above, among the two PCSELs overlapping each other when viewed from the Y-axis direction, the center of one PCSEL and the center of the other PCSEL overlap each other.

The end PCSELs 31*a*, 31*b*, 32*a*, 32*b*, 33*a*, 33*b*, 34*a*, 34*b*, 35*a*, and 35*b* are not driven. The intermediate PCSELs 31*c*, 32*c*, 33*c*, 34*c*, and 35*c* are driven.

Figure 2:
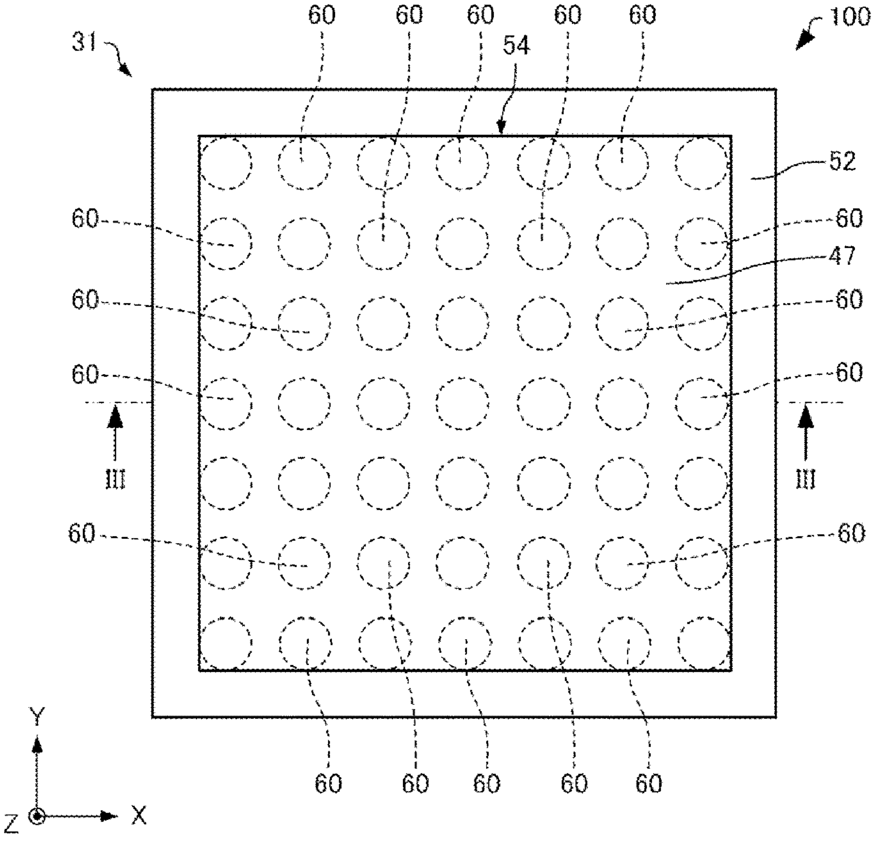
FIG. 2 is a plan view schematically illustrating a first photonic crystal laser of the processing head according to the first embodiment.
Figure 3:
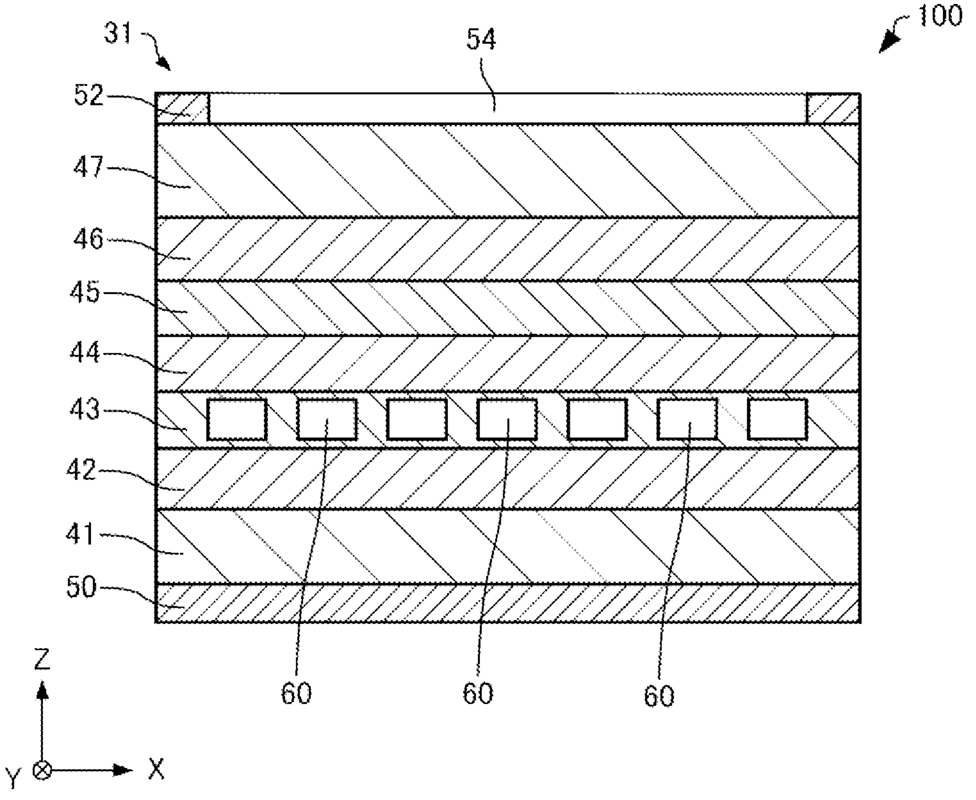
FIG. 3 is a cross-sectional view schematically illustrating the first photonic crystal laser of the processing head according to the first embodiment.

Here, FIG. 2 is a plan view schematically illustrating one first PCSEL 31. FIG. 3 is a cross-sectional view taken along line III-III in FIG. 2 schematically illustrating the one first PCSEL 31. The PCSELs 32, 33, 34, and 35 have basically the same configuration as the configuration of the first PCSEL 31.

As illustrated in FIGS. 2 and 3, the first PCSEL 31 includes, for example, a distributed Bragg reflector (DBR) layer 41, a first semiconductor layer 42, a first guide layer 43, a quantum well layer 44, a second guide layer 45, a second semiconductor layer 46, a substrate 47, a first electrode 50, and a second electrode 52.

The DBR layer 41 reflects light generated in the quantum well layer 44. In the illustrated example, the DBR layer 41 reflects the light generated in the quantum well layer 44 toward the +Z-axis direction.

As illustrated in FIG. 3, the first semiconductor layer 42 is provided on the DBR layer 41. The first semiconductor layer 42 is provided between the DBR layer 41 and the first guide layer 43. The first semiconductor layer 42 is a semiconductor layer of a first conductivity type. The first semiconductor layer 42 is, for example, a p-type semiconductor layer doped with Mg.

Note that in "1.1. Processing Head", when the quantum well layer 44 is a reference in the Z-axis direction, a direction from the quantum well layer 44 toward the second guide layer 45 is referred to as "above", and a direction from the quantum well layer 44 toward the first guide layer 43 is referred to as "below". Further, a direction orthogonal to the Z-axis direction is also referred to as "in-plane direction".

The first guide layer 43 is provided on the first semiconductor layer 42. The first guide layer 43 is provided between the first semiconductor layer 42 and the quantum well layer 44. The first guide layer 43 has, for example, a semiconductor superlattice (SL) structure composed of a GaN layer and an InGaN layer, which are an i-type and not intentionally doped with impurities. The numbers of the GaN layers and the InGaN layers composing the first guide layer 43 are not particularly limited.

Opening portions 60 are provided in the first guide layer 43. Each of the opening portions 60 is, for example, a hole. In the example illustrated in FIG. 2, the planar shape of the opening portion 60 is a circle. The diameter of the opening portion 60 is, for example, 50 nm or more and 500 nm or less.

Note that the "diameter of the opening portion 60" is a diameter when the planar shape of the opening portion 60 is a circle, and is a diameter of the minimum inclusion circle when the planar shape of the opening portion 60 is a shape other than the circle. For example, the diameter of the opening portion 60 is the diameter of the smallest circle that includes the polygon therein when the planar shape of the opening portion 60 is a polygon, and is the diameter of the smallest circle that includes the ellipse therein when the planar shape of the opening portion 60 is an ellipse.

A plurality of the opening portions 60 are provided. The plurality of opening portions 60 are separated from each other. A spacing between adjacent ones of the opening portions 60 is, for example, 1 nm or more and 500 nm or less. The plurality of opening portions 60 are arranged at a predetermined pitch in a predetermined direction when viewed from the Z-axis direction. The plurality of opening portions 60 are arranged in, for example, a regular triangular lattice pattern or a square lattice pattern. In the illustrated example, the plurality of opening portions 60 are arranged in the square lattice pattern. The plurality of opening portions 60 can exhibit the photonic crystal effect.

Note that the "pitch of the opening portions 60" is a distance between the centers of adjacent ones of the opening portions 60 in a predetermined direction. The "center of the opening portion 60" is a center of a circle when the planar shape of the opening portion 60 is the circle, and is a center of the minimum inclusion circle when the planar shape of the opening portion 60 is a shape other than the circle. For example, when the planar shape of the opening portion 60 is a polygon, the center of the opening portion 60 is the center of the smallest circle that includes the polygon therein, and when the planar shape of the opening portion 60 is an ellipse, the center of the opening portion 60 is the center of the smallest circle that includes the ellipse therein.

The quantum well layer 44 is provided on the first guide layer 43. The quantum well layer 44 is provided between the first guide layer 43 and the second guide layer 45. The quantum well layer 44 generates light when a current is injected thereinto. The quantum well layer 44 includes, for example, a well layer and a barrier layer. The well layer and the barrier layer are i-type semiconductor layers which are not intentionally doped with impurities. The well layer is, for example, the InGaN layer. The barrier layer is, for example, the GaN layer. The quantum well layer 44 has a multiple quantum well (MQW) structure composed of the well layer and the barrier layer.

Note that the numbers of the well layers and the barrier layers composing the quantum well layer 44 are not particularly limited. For example, only one well layer may be provided, and in this case, the quantum well layer 44 has a single quantum well (SQW) structure.

The second guide layer 45 is provided on the quantum well layer 44. The second guide layer 45 is provided between the quantum well layer 44 and the second semiconductor layer 46. The second guide layer 45 has, for example, the SL structure composed of the GaN layer and the InGaN layer which are the i-type and not intentionally doped with impurities. The numbers of the GaN layers and the InGaN layers composing the second guide layer 45 are not particularly limited. The first guide layer 43 and the second guide layer 45 have a function of increasing an optical confinement coefficient of the first PCSEL 31.

Note that although not illustrated, the plurality of opening portions 60 need not be provided in the first guide layer 43 and may be provided in the second guide layer 45.

The second semiconductor layer 46 is provided above the quantum well layer 44. The second semiconductor layer 46 is provided between the quantum well layer 44 and the substrate 47. The second semiconductor layer 46 is a semiconductor layer of a second conductivity type different from the first conductivity type. The second semiconductor layer 46 is, for example, an n-type GaN layer doped with Si. The first semiconductor layer 42 and the second semiconductor layer 46 are clad layers having a function of confining light in the quantum well layer 44.

In the first PCSEL 31, a pin diode is constituted by the first semiconductor layer 42 of the p-type, the quantum well layer 44 and the guide layer 43 and 45 which are the i-type and not intentionally doped with impurities, and the second semiconductor layer 46 of the n-type. In the first PCSEL 31, when a forward bias voltage of the pin diode is applied between the first electrode 50 and the second electrode 52, a current is injected into the quantum well layer 44, and electrons and electron holes having positive electrical charge are recombined in the quantum well layer 44. This recombination causes light emission. The light generated in the quantum well layer 44 propagates in the in-plane direction, forms a standing wave by the photonic crystal effect due to the plurality of opening portions 60, receives a gain in the quantum well layer 44, and performs laser oscillation. Then, the first PCSEL 31 emits a +1st order diffracted light and a −1st order diffracted light as the laser light in the Z-axis direction.

In the first PCSEL 31, the laser light traveling in the −Z-axis direction can be reflected in the +Z-axis direction by the DBR layer 41. Thus, in the first PCSEL 31, the laser light can be emitted in the +Z-axis direction.

The substrate 47 is provided on the second semiconductor layer 46. The substrate 47 is provided between the second semiconductor layer 46 and the second electrode 52. The substrate 47 is, for example, an n-type semiconductor substrate in which Si is doped.

The first electrode 50 is provided below the DBR layer 41. The DBR layer 41 may be in ohmic contact with the first electrode 50. The first electrode 50 is electrically coupled to the first semiconductor layer 42 via the DBR layer 41. The first electrode 50 is formed by, for example, stacking a Ni layer and an Au layer in this order from the DBR layer 41 side. The first electrode 50 is one electrode configured to inject a current into the quantum well layer 44.

The second electrode 52 is provided on the substrate 47. The substrate 47 may be in ohmic contact with the second electrode 52. The second electrode 52 is electrically coupled to the second semiconductor layer 46 via the substrate 47. The second electrode 52 is formed by, for example, stacking a Cr layer, a Ni layer, and an Au layer in this order from the substrate 47 side. The second electrode 52 is the other electrode configured to inject a current into the quantum well layer 44.

A through hole 54 is provided in the second electrode 52. The through hole 54 penetrates the second electrode 52 in the Z-axis direction. In the example illustrated in FIG. 2, the shape of the through hole 54 is square. The light generated in the quantum well layer 44 is emitted through the through hole 54.

For example, in the plurality of first PCSELs 31 constituting the first laser array element **20*a*, the DBR layer 41 is a common layer, the first semiconductor layer 42 is a common layer, the first guide layer 43 is a common layer, the quantum well layer 44 is a common layer, the second guide layer 45 is a common layer, the second semiconductor layer 46 is a common layer, and the substrate 47** is a common substrate.

In the plurality of first PCSELs 31 constituting the first laser array element **20*a*, the first electrodes 50 may be a common electrode and the second electrodes 52 may be individual electrodes. In the plurality of first PCSELs 31 constituting the first laser array element 20*a*, a plurality of the first electrodes 50 may be continuous with each other, and a plurality of the second electrodes 52 may be separated from each other. In this case, when viewed from the Z-axis direction, a portion overlapping the second electrode 52 and the through hole 54 constitutes one first PCSEL 31. Each of the plurality of first PCSELs 31 can be individually driven by a respective one of the second electrodes 52**.

Alternatively, in the plurality of first PCSELs 31 constituting the first laser array element 20*a*, the first electrodes 50 may be the individual electrodes and the second electrodes 52 may be the common electrode. In the plurality of first PCSELs 31 constituting the first laser array element 20*a*, the plurality of first electrodes 50 may be separated from each other, and the plurality of second electrodes 52 may be continuous with each other. In this case, when viewed from the Z-axis direction, a portion overlapping the first electrodes 50 constitutes one first PCSEL 31. Each of the plurality of first PCSELs 31 can be individually driven by a respective one of the first electrodes 50.

1.2. Method of Manufacturing Processing Head

Next, a method of manufacturing the processing head 100 according to the first embodiment will be described with reference to the accompanying drawings. FIGS. 4 to 7 are cross-sectional views schematically illustrating a manufacturing process of the processing head 100 according to the first embodiment. Note that for the sake of convenience, FIGS. 4 to 7 are illustrated upside down from FIG. 3.

Figure 4:
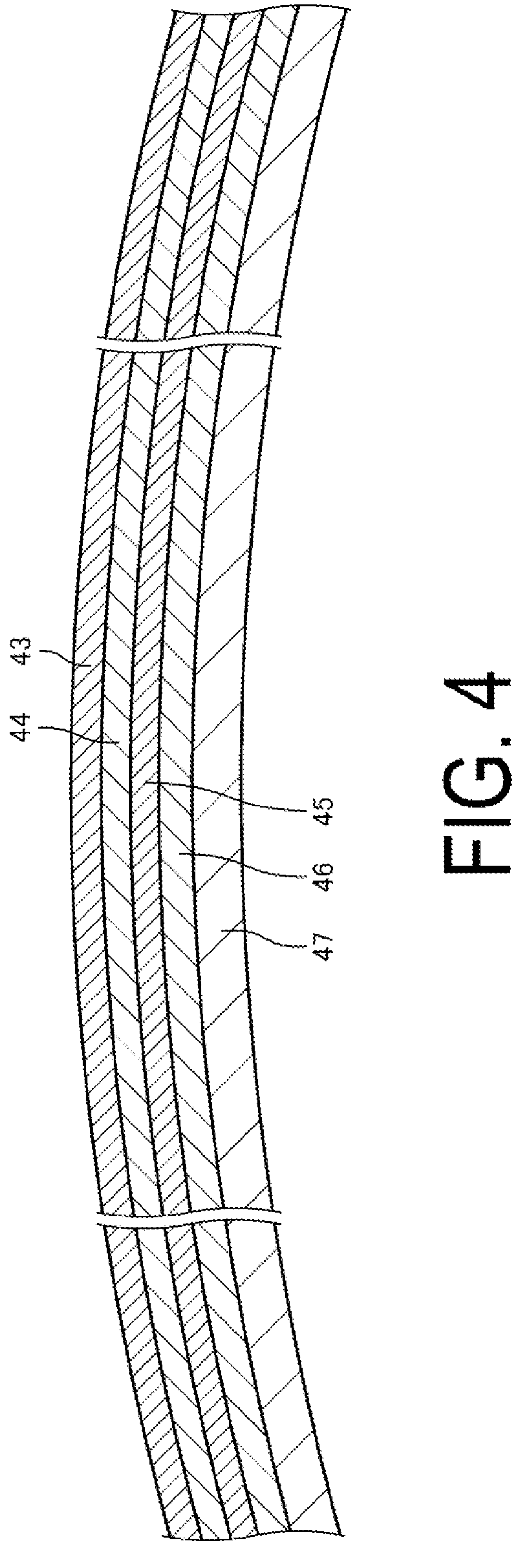
FIG. 4 is a cross-sectional view schematically illustrating a manufacturing process of the processing head according to the first embodiment.

As illustrated in FIG. 4, the second semiconductor layer 46, the second guide layer 45, the quantum well layer 44, and the first guide layer 43 are epitaxially grown on the substrate 47. Examples of the method of epitaxial growth include a metal organic chemical vapor deposition (MOCVD) method, a molecular beam epitaxy (MBE) method, and the like.

Note that in "1.2. Method of Manufacturing Processing Head", a direction from the quantum well layer 44 toward the first guide layer 43 is referred to as "above", and a direction from the quantum well layer 44 toward the second guide layer 45 is referred to as "below".

For example, warpage occurs in the substrate 47 due to heating during the epitaxial growth and subsequent cooling. In the illustrated example, warpage occurs such that the central portion of the substrate 47 is located above the peripheral portion of the substrate 47. As the substrate 47 warps, warpage also occurs in the second semiconductor layer 46, the second guide layer 45, the quantum well layer 44, and the first guide layer 43. Note that for the sake of convenience, the warpage of the substrate 47 is omitted in FIG. 3.

Figure 5:
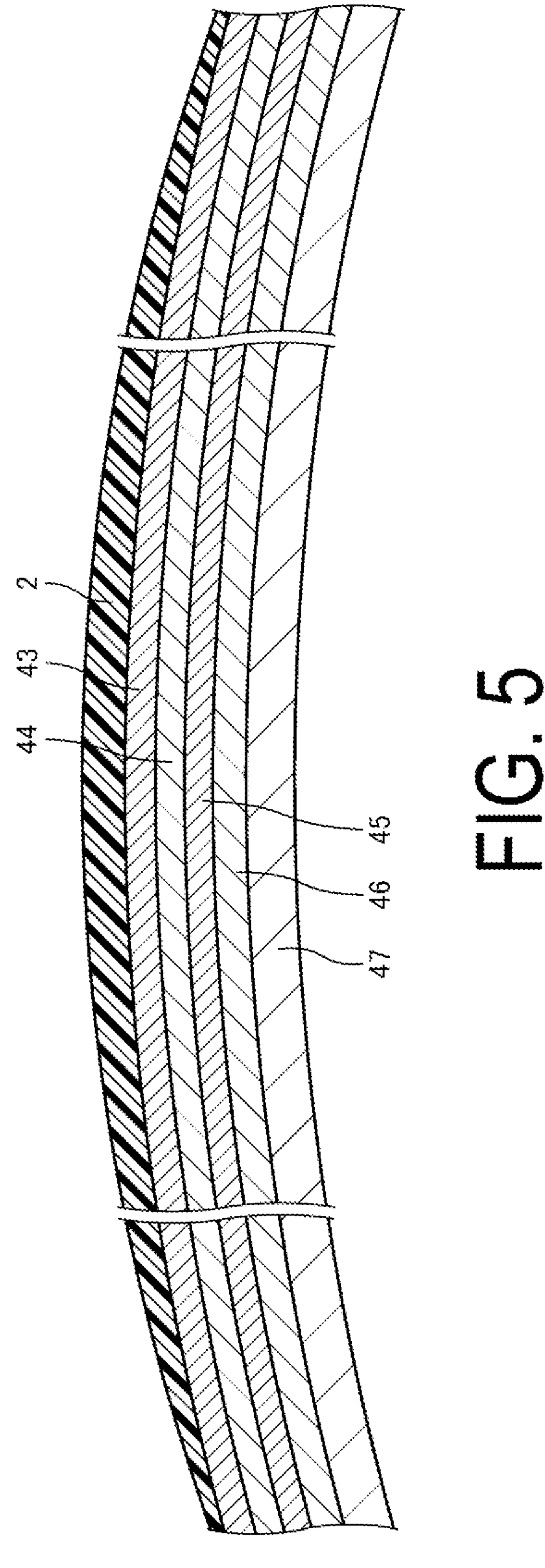
FIG. 5 is a cross-sectional view schematically illustrating a manufacturing process of the processing head according to the first embodiment.

As illustrated in FIG. 5, a resist layer 2 is applied onto the first guide layer 43. The resist layer 2 is applied by, for example, a spin coating method. Due to the warpage of the substrate 47, the thickness of the peripheral portion of the resist layer 2 is smaller than the thickness of the central portion of the resist layer 2. A material of the resist layer 2 is, for example, a photoresist whose property changes by ultraviolet (UV).

Figure 6:
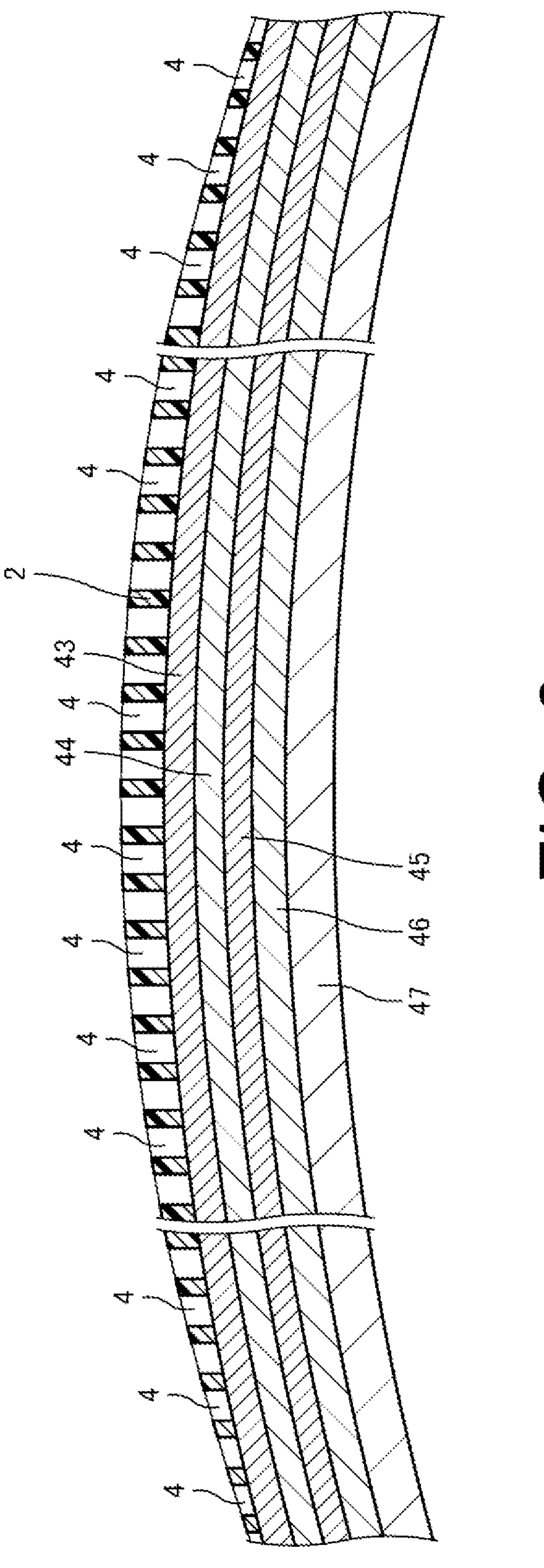
FIG. 6 is a cross-sectional view schematically illustrating a manufacturing process of the processing head according to the first embodiment.

As illustrated in FIG. 6, the resist layer 2 is patterned. The patterning is performed by, for example, a nanoimprint method. A large area can be processed in a lump by the nanoimprint method.

Figure 7:
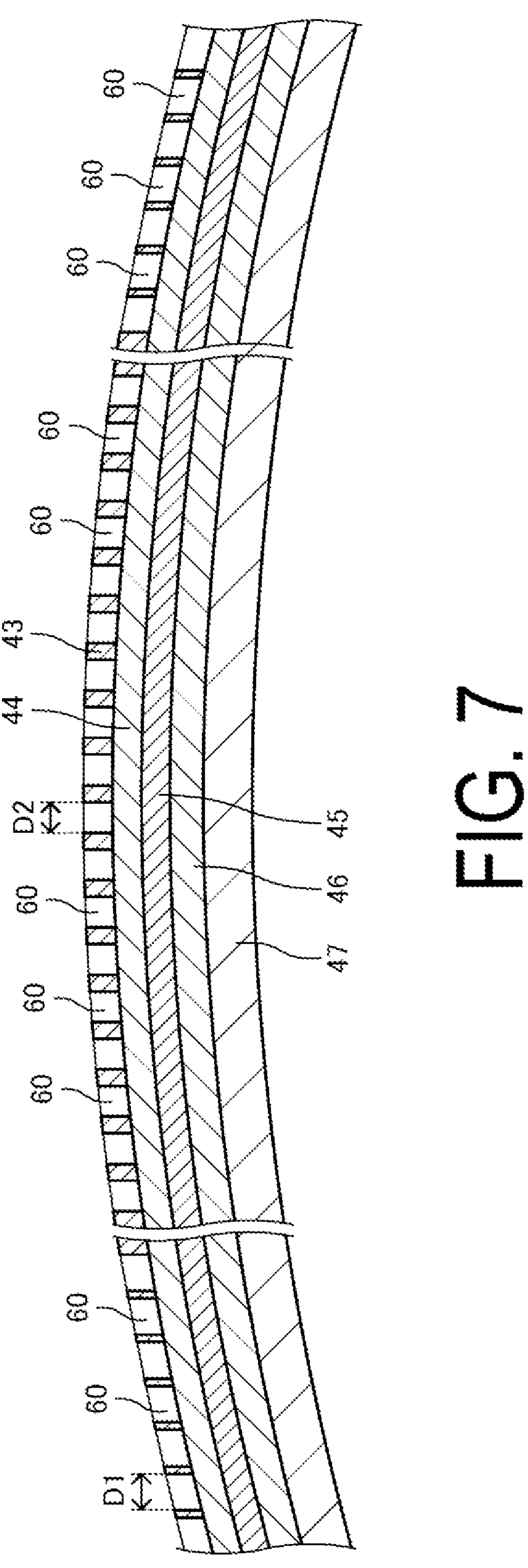
FIG. 7 is a cross-sectional view schematically illustrating a manufacturing process of the processing head according to the first embodiment.

As illustrated in FIG. 7, the first guide layer 43 is dry-etched using the resist layer 2 as a mask to form the plurality of opening portions 60 in the first guide layer 43. As described above, the thickness of the peripheral portion of the resist layer 2 is smaller than the thickness of the central portion of the resist layer 2, and thus the peripheral portion of the resist layer 2 is removed during the dry etching. Thus, the peripheral portion of the first guide layer 43 is subjected to side etching, and a diameter D1 of the opening portion 60 in the peripheral portion is larger than a diameter D2 of the opening portion 60 in the central portion. Thereafter, the resist layer 2 is removed by a known method.

As illustrated in FIG. 7, after the opening portions 60 are formed, the first guide layer 43 is further epitaxially grown. Thus, the opening portions 60 are sealed. Examples of the method of epitaxial growth include the MOCVD method, the MBE method, and the like.

Next, the first semiconductor layer 42 and the DBR layer 41 are epitaxially grown in this order on the first guide layer 43. Examples of the method of epitaxial growth include the MOCVD method, the MBE method, and the like.

Next, the first electrode 50 is formed on the DBR layer 41. Next, the second electrode 52 is formed on the substrate 47. The first electrode 50 and the second electrode 52 are formed by, for example, a vacuum deposition method. Note that the order of forming the first electrode 50 and the second electrode 52 is not particularly limited.

Next, the second electrode 52 is patterned to form the through hole 54. The patterning is performed by, for example, photolithography and etching.

By the processes described above, the first laser array element 20*a* including the plurality of first PCSELs 31 with the substrate 47 as the common substrate can be formed.

By repeating the above processes, the second laser array element 20*b* including the plurality of second PCSELs 32, the third laser array element 20*c* including the plurality of third PCSELs 33, the fourth laser array element 20*d* including the plurality of fourth PCSELs 34, and the fifth laser array element 20*e* including the plurality of fifth PCSELs 35 can be formed.

Next, the laser array elements 20*a*, 20*b*, 20*c*, 20*d*, and 20*e* are bonded to the substrate 10. For example, the first electrodes 50 of the laser array elements 20*a*, 20*b*, 20*c*, 20*d*, and 20*e*, respectively, are bonded to the substrate 10 by solder (not illustrated).

The processing head 100 can be manufactured by the above processes.

1.3. Effects

The processing head 100 includes the first laser array element 20*a* in which the plurality of first PCSELs 31 are arranged in the +X-axis direction and the second laser array element 20*b* in which the plurality of second PCSELs 32 are arranged in the +X-axis direction. The first laser array element 20*a* and the second laser array element 20*b* emit laser light toward the processing target object in the +Z-axis direction while being relatively moved with respect to the processing target object in the +Y-axis direction. When viewed from the +Y-axis direction, the second end PCSEL 31*b* and the second intermediate PCSEL 32*c* overlap each other.

Here, the second end PCSEL 31*b* is located closer to the peripheral portion than the first intermediate PCSEL 31*c*, and thus the diameter of the opening portion 60 is larger than a desired value as described above. Thus, in the second end PCSEL 31*b*, an oscillation wavelength, an oscillation threshold, a light intensity, and the like are deviated from desired values, respectively.

As described above, in the processing head 100, the second end PCSEL 31*b* and the second intermediate PCSEL 32*c* overlap each other when viewed from the +Y-axis direction, and thus a region of the processing target object where the second end PCSEL 31*b* passes can be laser-processed by not emitting the laser light from the second end PCSEL 31*b* and by emitting the laser light from the second intermediate PCSEL 32*c* overlapping the second end PCSEL 31*b* when viewed from the +Y-axis direction. Thus, the processing head 100 can process the processing target object with high accuracy.

In the processing head 100, when viewed from the +Y-axis direction, the third end PCSEL 32*a* and the first intermediate PCSEL 31*c* overlap each other. Thus, in the processing head 100, a region of the processing target object where the third end PCSEL 32*a* passes can be laser-processed by not emitting the laser light from the third end PCSEL 32*a* and by emitting the laser light from the first intermediate PCSEL 31*c* overlapping the third end PCSEL 32*a* when viewed from the +Y-axis direction.

The processing head 100 includes the third laser array element 20*c* in which the plurality of third PCSELs 33 are arranged in the +X-axis direction. The third laser array element 20*c* emit laser light toward the processing target object in the +Z-axis direction while being relatively moved with respect to the processing target object in the +Y-axis direction. When viewed from the +Y-axis direction, the fourth end PCSEL 32*b* and the third intermediate PCSEL 33*c* overlap each other. Thus, in the processing head 100, a region of the processing target object where the fourth end PCSEL 32*b* passes can be laser-processed by not emitting the laser light from the fourth end PCSEL 32*b* and by emitting the laser light from the third intermediate PCSEL 33*c* overlapping the fourth end PCSEL 32*b* when viewed from the +Y-axis direction. Further, by providing the third laser array element 20*c*, a processing region of the processing target object and a production speed can be increased.

In the processing head 100, when viewed from the +Y-axis direction, the fifth end PCSEL 33*a* and the second intermediate PCSEL 32*c* overlap each other. Thus, in the processing head 100, a region of the processing target object where the fifth end PCSEL 33*a* passes can be laser-processed by not emitting the laser light from the fifth end PCSEL 33*a* and by emitting the laser light from the second intermediate PCSEL 32*c* overlapping the fifth end PCSEL 33*a* when viewed from the +Y-axis direction.

In the processing head 100, the first PCSEL 31 and the third PCSEL 33 are arranged in the +X-axis direction. Thus, in the processing head 100, the size of the processing head 100 in the +Y-axis direction can be reduced as compared with a case where the first PCSEL and the third PCSEL are not arranged in the +X-axis direction.

In the processing head 100, the plurality of first PCSELs 31 are arranged at the first pitch P, and the plurality of second PCSEL 32 are arranged at the first pitch P. Thus, in the processing head 100, the laser light can be emitted to the processing target object at equal spacing.

In the processing head 100, when viewed from the +Y-axis direction, the center α of the second end PCSEL 31*b* and the center β of the second intermediate PCSEL 32*c* overlap each other. Thus, in the processing head 100, the laser light can be further securely emitted to the processing target object at equal spacing.

Although the example is described above in which the photonic crystal effect is exhibited by forming the plurality of opening portions 60 in the first guide layer 43, the photonic crystal effect may be exhibited by forming a plurality of column portions. The plurality of column portions are formed by the epitaxial growth using a mask layer (not illustrated) as a mask. The column portions in the peripheral portion among the plurality of column portions is excessively supplied with a gas for growth and are more likely to be abnormally grown than the column portions in the central portion. Thus, even when the photonic crystal effect is exhibited by forming the plurality of column portions, the oscillation wavelength, the oscillation threshold, the light intensity, and the like are likely to deviate from the desired values, respectively, in the second end PCSEL 31*b*. Thus, even in such a case, the processing target object can be processed with high accuracy by overlapping the second end PCSEL 31*b* and the second intermediate PCSEL 32*c* when viewed from the +Y-axis direction.

1.4. Modification of Processing Head 1.4.1. First Modification

Figure 8:
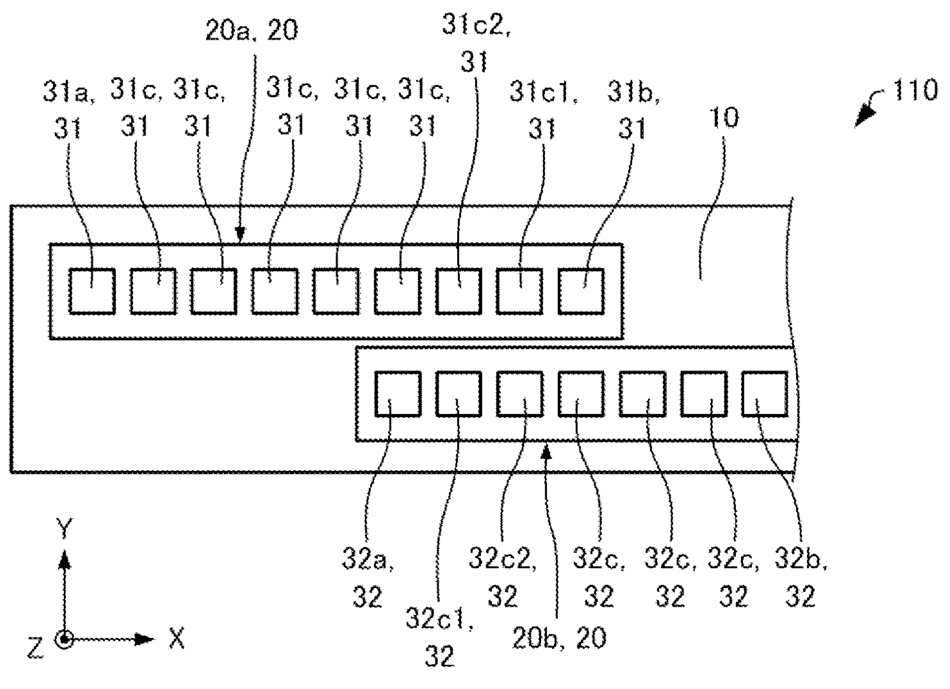
FIG. 8 is a plan view schematically illustrating a processing head according to a first modification of the first embodiment.

Next, a processing head according to a first modification of the first embodiment will be described with reference to the accompanying drawings. FIG. 8 is a plan view schematically illustrating a processing head 110 according to the first modification of the first embodiment.

Hereinafter, in the processing head 110 according to the first modification of the first embodiment, members having the same functions as the constituent members of the processing head 100 according to the first embodiment described above are denoted by the same reference numerals, and detailed description thereof will be omitted. The same applies to a processing head according to a second modification described later of the first embodiment.

In the above-described processing head 100, as illustrated in FIG. 1, the first intermediate PCSEL 31*c* of the first laser array element 20*a* and the second intermediate PCSEL 32*c* of the second laser array element 20*b* do not overlap each other when viewed from the +Y-axis direction.

On the other hand, in the processing head 110, as illustrated in FIG. 8, the first intermediate PCSEL 31*c* and the second intermediate PCSEL 32*c* overlap each other when viewed from the +Y-axis direction. In the illustrated example, seven first intermediate PCSELs 31*c* are provided. Seven second intermediate PCSEL 32*c* are provided.

In the illustrated example, when viewed from the +Y-axis direction, a first intermediate PCSEL 31*c*1 located in the most +X-axis direction among the plurality of first intermediate PCSEL 31*c* and the second intermediate PCSEL 32*c*2 located in the second most −X-axis direction among the plurality of second intermediate PCSEL 32*c* overlap each other.

When viewed from the +Y-axis direction, the first intermediate PCSEL 31*c*2 located in the second most +X-axis direction among the plurality of first intermediate PCSEL 31*c* and the second intermediate PCSEL 32*c*1 located in the most −X-axis direction among the plurality of second intermediate PCSEL 32*c* overlap each other. The intermediate PCSEL 31*c*1 and 32*c*1 are not driven.

In the processing head 110, a region of the processing target object where the first intermediate PCSEL 31*c*1 passes can be laser-processed by not emitting the laser light from the first intermediate PCSEL 31*c*1 and by emitting the laser light from the second intermediate PCSEL 32*c*2 overlapping the first intermediate PCSEL 31*c*1 when viewed from the Y-axis direction. Further, a region of the processing target object where the second intermediate PCSEL 32*c*1 passes can be laser-processed by not emitting the laser light from the second intermediate PCSEL 32*c*1 and by emitting the laser light from the first intermediate PCSEL 31*c*2 overlapping the second intermediate PCSEL 32*c*1 when viewed from the Y-axis direction.

1.4.2. Second Modification

Figure 9:
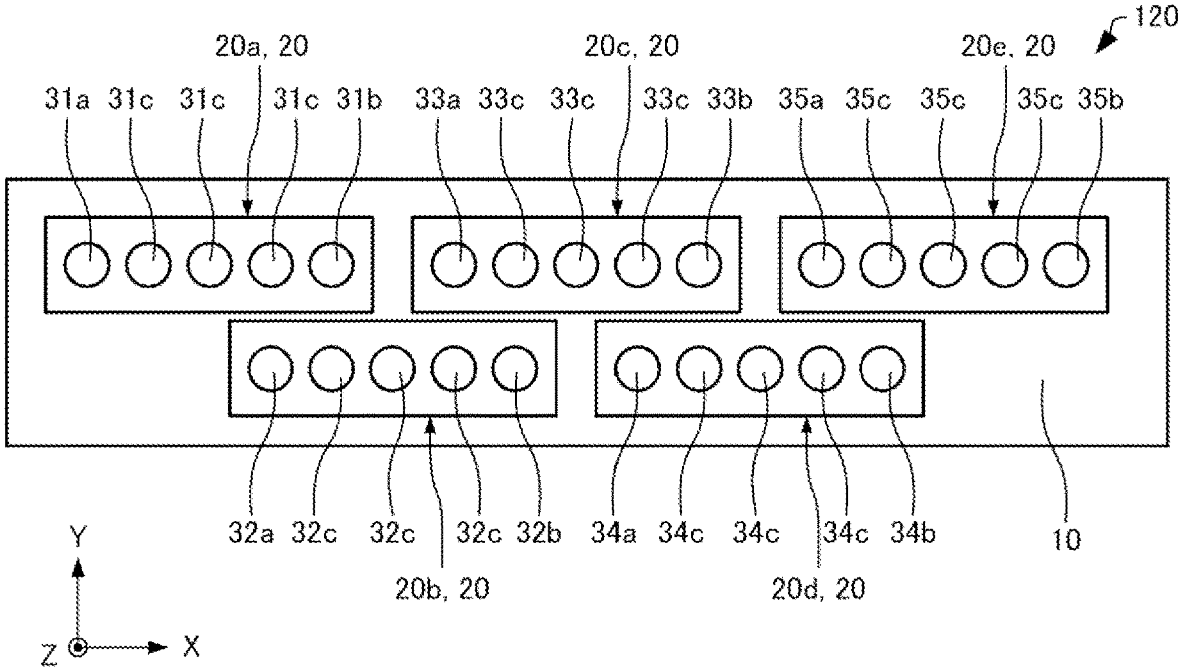
FIG. 9 is a plan view schematically illustrating a processing head according to a second modification of the first embodiment.
Figure 10:
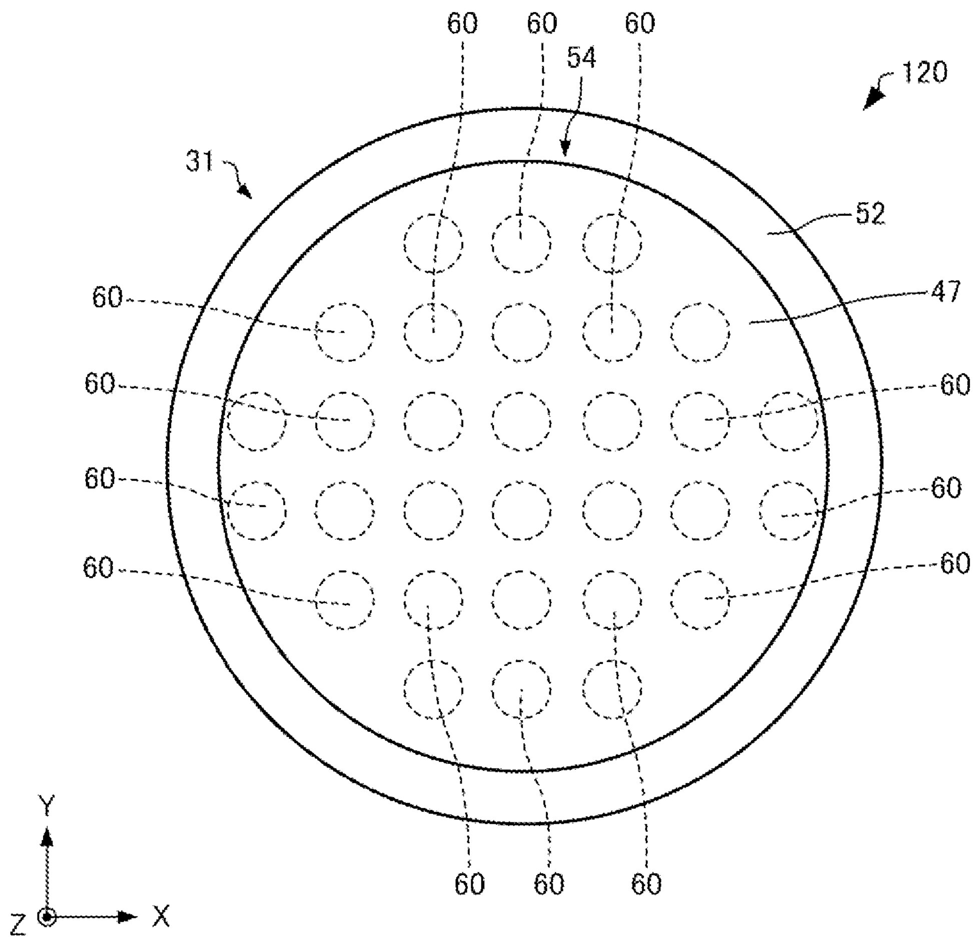
FIG. 10 is a plan view schematically illustrating a first photonic crystal laser of the processing head according to the second modification of the first embodiment.

Next, a processing head according to a second modification of the first embodiment will be described with reference to the accompanying drawings. FIG. 9 is a plan view schematically illustrating a processing head 120 according to the second modification of the first embodiment. FIG. 10 is a plan view schematically illustrating the first PCSEL 31 of the processing head 120 according to the second modification of the first embodiment.

In the above-described processing head 100, as illustrated in FIGS. 1 and 2, the planar shape of the first PCSEL 31 is square.

On the other hand, in the processing head 120, as illustrated in FIGS. 9 and 10, the planar shape of the first PCSEL 31 is a circle. Similarly, the planar shapes of the PCSELs 32, 33, 34, and 35 are the circle.

2. Second Embodiment

Figure 11:
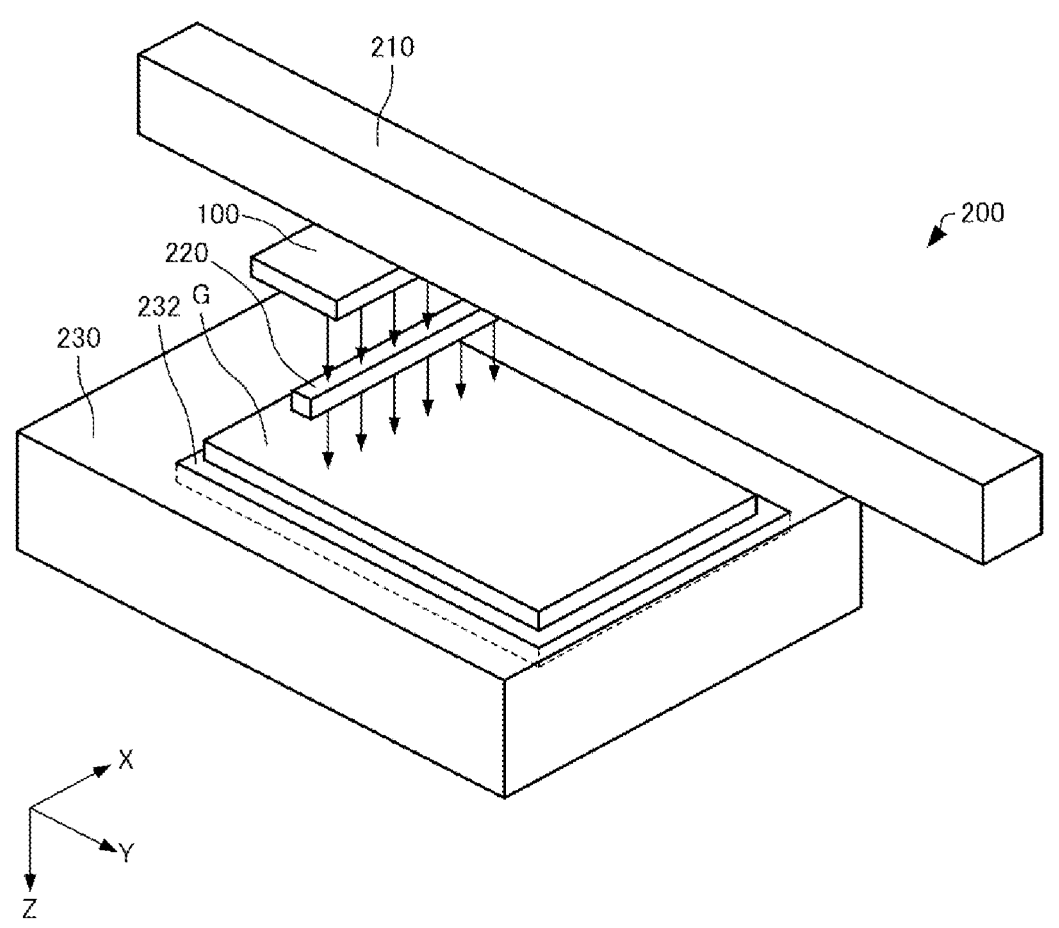
FIG. 11 is a perspective view schematically illustrating a laser processing apparatus according to a second embodiment.
Figure 12:
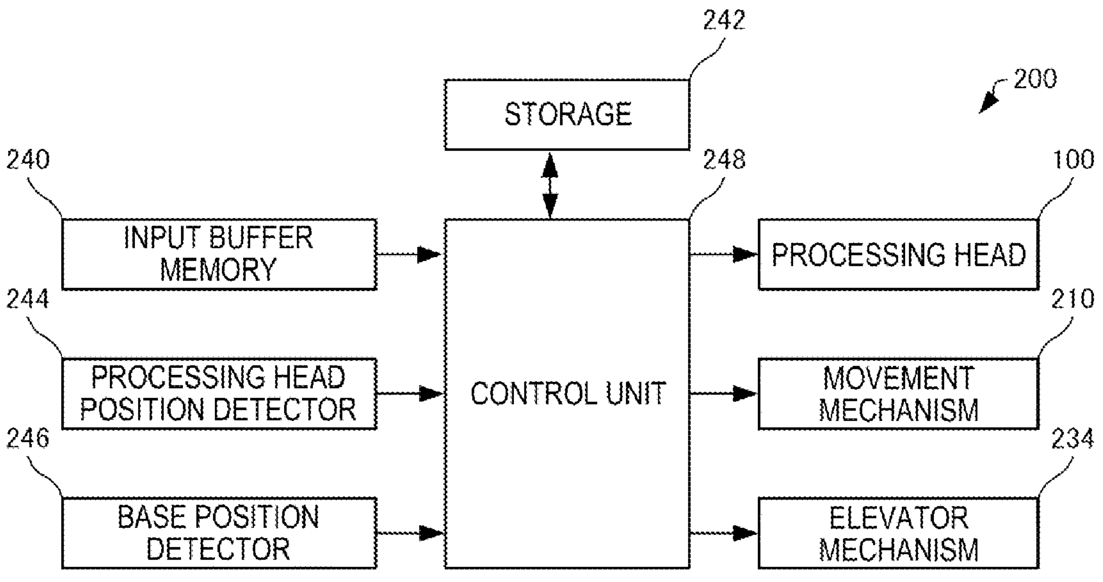
FIG. 12 is a functional block diagram of the laser processing apparatus according to the second embodiment.

Next, a laser processing apparatus according to a second embodiment will be described with reference to the accompanying drawings. FIG. 11 is a perspective view schematically illustrating a laser processing apparatus 200 according to the second embodiment. FIG. 12 is a functional block diagram of the laser processing apparatus 200 according to the second embodiment.

The laser processing apparatus 200 is, for example, a metal 3D printer using a selective laser melting (SLM) method. As illustrated in FIGS. 11 and 12, the laser processing apparatus 200 includes, for example, a processing head 100, a moving mechanism 210, a condensing lens 220, a stage 230, an input buffer memory 240, a storage 242, a processing head position detector 244, a base position detector 246, and a control unit 248.

As illustrated in FIG. 11, the moving mechanism 210 supports the processing head 100. In the illustrated example, the processing head 100 is located in the +Z-axis direction of the moving mechanism 210. The moving mechanism 210 moves the processing head 100 in the Y-axis direction. In the illustrated example, the moving mechanism 210 has a shape extending in the Y-axis direction. The moving mechanism 210 includes, for example, a motor (not illustrated).

The condensing lens 220 condenses the laser light emitted from the processing head 100. In the illustrated example, the condensing lens 220 is located in the +Z-axis direction of the processing head 100. The condensing lens 220 moves in the Y-axis direction as the processing head 100 moves. The condensing lens 220 is supported by, for example, a moving mechanism (not illustrated).

The stage 230 includes, for example, a base 232 and an elevator mechanism 234. Metal particles G to be the processing target object are supplied to the base 232. The metal particles G are irradiated with the laser light emitted from the condensing lens 220. The elevator mechanism 234 moves the base 232 in the Z-axis direction.

The input buffer memory 240 receives data, that is, drawing pattern data, relating to laser irradiation by the processing head 100 from an external information processing device (not illustrated). As illustrated in FIG. 12, the input buffer memory 240 supplies the drawing pattern data to the control unit 248. The control unit 248 stores the drawing pattern data in the storage 242. The input buffer memory 240 and the storage 242 are constituted by, for example, a random access memory (RAM) and a read only memory (ROM).

The processing head position detector 244 detects a position of the processing head 100 in the Y-axis direction and inputs a detected signal to the control unit 248. The base position detector 246 detects a position of the base 232 in the Z-axis direction and inputs a detected signal to the control unit 248. The processing head position detector 244 and the base position detector 246 are constituted by, for example, a linear encoder, a laser length measuring instrument, or the like.

The control unit 248 controls the moving mechanism 210 and the elevator mechanism 234 based on the detected signals of the processing head position detector 244 and the base position detector 246. Further, the control unit 248 reads out the drawing pattern data stored in the storage 242, and controls the processing head 100 based on the read out drawing pattern data. The control unit 248 is constituted by, for example, a central processing unit (CPU) and a dedicated circuit.

In the laser processing apparatus 200, first, the metal particles G to be a first layer of the processing target object are supplied to the base 232. Next, the control unit 248 performs an irradiation process of irradiating the metal particles G to be the first layer with the laser light by controlling the moving mechanism 210 and controlling the processing head 100 based on the drawing pattern data while moving the processing head 100 in the +Y-axis direction. A portion of the metal particles G irradiated with the laser light is melted and solidified.

Next, the control unit 248 performs a moving process of returning the processing head 100 to the initial position by controlling the moving mechanism 210 to move the processing head 100 in the −Y-axis direction, and moving the base 232 by one layer in the +Z-axis direction by controlling the elevator mechanism 234 of the stage 230.

Then, based on the drawing pattern data, the control unit 248 repeats the irradiation process and the moving process described above until it is determined that all the layers of the processing target object are formed.

After it is determined that all the layers of the processing target object is formed, portions of the metal particles G, which are not melted and not solidified, are removed by, for example, air blowing or the like.

As described above, the processing target object having a desired shape can be formed.

The laser processing apparatus 200 includes the processing head 100. Thus, variation in the degree of melting of the metal particles G can be reduced.

Unlike a case where a fiber laser is used, the laser processing apparatus 200 does not require a Galvano scanner and an fθ lens to be provided, and thus the size and the cost can be reduced accordingly.

Note that the laser processing apparatus according to the present disclosure is not limited to the metal 3D printer. The laser processing apparatus according to the present disclosure may be, for example, a laser cleaner that removes rust or the like attached to metal by the laser light. Further, the laser processing apparatus according to the present disclosure may be a laser annealing apparatus that heats a surface of metal or resin by the laser light.

The above-described embodiments and modifications are merely examples, and the present disclosure is not limited thereto. For example, the embodiments and the modifications may be combined as appropriate.

The present disclosure includes substantially the same configuration as the configurations described in the embodiments, for example, a configuration having the same function, method, and result or a configuration having the same object and effect. In addition, the present disclosure includes a configuration in which non-essential parts of the configurations described in the embodiments are replaced. In addition, the present disclosure includes a configuration that achieves the same effects or a configuration that can achieve the same object as the configurations described in the embodiments. In addition, the present disclosure includes a configuration in which a known technique is added to the configurations described in the embodiments.

The following contents are derived from the above-described embodiments and modifications.

One aspect of a processing head includes a first laser array element in which a plurality of first photonic crystal lasers are arranged in a first direction, a second laser array element in which a plurality of second photonic crystal lasers are arranged in the first direction, wherein the first laser array element and the second laser array element emit laser light in a third direction intersecting the first direction and a second direction to a processing target object while being relatively moved with respect to the processing target object in the second direction intersecting the first direction, and a first end photonic crystal laser among the plurality of first photonic crystal lasers is located furthest in an opposite direction from the first direction among the plurality of first photonic crystal lasers, and a second end photonic crystal laser among the plurality of first photonic crystal lasers is located furthest in the first direction among the plurality of first photonic crystal lasers, and a first intermediate photonic crystal laser among the plurality of first photonic crystal lasers is located between the first end photonic crystal laser and the second end photonic crystal laser, a third end photonic crystal laser among the plurality of second photonic crystal lasers is located furthest in the opposite direction among the plurality of second photonic crystal lasers, and a fourth end photonic crystal laser among the plurality of second photonic crystal lasers is located furthest in the first direction among the plurality of second photonic crystal lasers, and a second intermediate photonic crystal laser among the plurality of second photonic crystal lasers is located between the third end photonic crystal laser and the fourth end photonic crystal laser, and when viewed from the second direction, the second end photonic crystal laser and the second intermediate photonic crystal laser overlap each other.

According to the processing head, the processing target object can be processed with high accuracy.

In one aspect of the processing head when viewed from the second direction, the third end photonic crystal laser and the first intermediate photonic crystal laser may overlap each other.

According to the processing head, a region of the processing target object where the third end photonic crystal laser passes can be laser-processed by emitting the laser light from the first intermediate photonic crystal laser overlapping the third end photonic crystal laser when viewed from the second direction.

In one aspect of the processing head, a third laser array element in which a plurality of third photonic crystal lasers are arranged in the first direction may be included wherein the third laser array element may emit laser light in the third direction toward the processing target object while being relatively moved with respect to the processing target object in the second direction, a fifth end photonic crystal laser among the plurality of third photonic crystal lasers may be located furthest in the opposite direction among the plurality of third photonic crystal lasers, a sixth end photonic crystal laser among the plurality of third photonic crystal lasers may be located furthest in the first direction among the plurality of third photonic crystal lasers, the third intermediate photonic crystal laser among the plurality of third photonic crystal lasers may be located between the fifth end photonic crystal laser and the sixth end photonic crystal laser, and when viewed from the second direction, the fourth end photonic crystal laser and the third intermediate photonic crystal laser may overlap each other.

According to the processing head, a region of the processing target object where the fourth end photonic crystal laser passes can be laser-processed by emitting the laser light from the third intermediate photonic crystal laser overlapping the fourth end photonic crystal laser when viewed from the second direction.

In one aspect of the processing head when viewed from the second direction, the fifth end photonic crystal laser and the second intermediate photonic crystal laser may overlap each other.

According to the processing head, a region of the processing target object where the fifth end photonic crystal laser passes can be laser-processed by emitting the laser light from the second intermediate photonic crystal laser overlapping the fifth end photonic crystal laser when viewed from the second direction.

In one aspect of the processing head, the first laser array element and the third laser array element may be arranged in the first direction.

According to the processing head, the size in the second direction can be reduced.

In one aspect of the processing head, the plurality of first photonic crystal lasers may be arranged at a first pitch and the plurality of second photonic crystal lasers may be arranged at the first pitch.

According to the processing head, the processing target object can be irradiated with the laser light at equal spacing.

In one aspect of the processing head when viewed from the second direction, a center of the second end photonic crystal laser and a center of the second intermediate photonic crystal laser may overlap each other.

According to the processing head, the laser light can be further securely emitted to the processing target object at equal spacing.

One aspect of the laser processing apparatus includes one aspect of the above-described processing head.

What is claimed is:

1. A processing head comprising:

a first laser array element including a plurality of first photonic crystal lasers arranged in a first direction;

a second laser array element including a plurality of second photonic crystal lasers arranged in the first direction, wherein the first laser array element and the second laser array element emit laser light in a third direction intersecting the first direction and a second direction to a processing target object while being relatively moved with respect to the processing target object in the second direction intersecting the first direction, a first end photonic crystal laser among the plurality of first photonic crystal lasers is located furthest in an opposite direction from the first direction among the plurality of first photonic crystal lasers, a second end photonic crystal laser among the plurality of first photonic crystal lasers is located furthest in the first direction among the plurality of first photonic crystal lasers, a first intermediate photonic crystal laser among the plurality of first photonic crystal lasers is located between the first end photonic crystal laser and the second end photonic crystal laser, a third end photonic crystal laser among the plurality of second photonic crystal lasers is located furthest in the opposite direction among the plurality of second photonic crystal lasers, a fourth end photonic crystal laser among the plurality of second photonic crystal lasers is located furthest in the first direction among the plurality of second photonic crystal lasers, a second intermediate photonic crystal laser among the plurality of second photonic crystal lasers is located between the third end photonic crystal laser and the fourth end photonic crystal laser, and when viewed from the second direction, the second end photonic crystal laser and the second intermediate photonic crystal laser next to the third end photonic crystal laser overlap each other.

2. The processing head according to claim 1, wherein when viewed from the second direction, the third end photonic crystal laser and the first intermediate photonic crystal laser overlap each other.

3. The processing head according to claim 1, further comprising a third laser array element including a plurality of third photonic crystal lasers arranged in the first direction, wherein the third laser array element emits laser light in the third direction toward the processing target object while being relatively moved with respect to the processing target object in the second direction, a fifth end photonic crystal laser among the plurality of third photonic crystal lasers is located furthest in the opposite direction among the plurality of third photonic crystal lasers, a sixth end photonic crystal laser among the plurality of third photonic crystal lasers is located furthest in the first direction among the plurality of third photonic crystal lasers, a third intermediate photonic crystal laser among the plurality of third photonic crystal lasers is located between the fifth end photonic crystal laser and the sixth end photonic crystal laser, and when viewed from the second direction, the fourth end photonic crystal laser and the third intermediate photonic crystal laser overlap each other.

4. The processing head according to claim 3, wherein when viewed from the second direction, the fifth end photonic crystal laser and the second intermediate photonic crystal laser overlap each other.

5. The processing head according to claim 3, wherein the first laser array element and the third laser array element are arranged in the first direction.

6. The processing head according to claim 1, wherein the plurality of first photonic crystal lasers is arranged at a first pitch and the plurality of second photonic crystal lasers is arranged at the first pitch.

7. The processing head according to claim 6, wherein when viewed from the second direction, a center of the second end photonic crystal laser and a center of the second intermediate photonic crystal laser overlap each other.

8. A laser processing apparatus comprising the processing head according to claim 1.

9. A processing head comprising:

a first laser array element including a plurality of first photonic crystal lasers arranged in a first direction;

a second laser array element including a plurality of second photonic crystal lasers arranged in the first direction, wherein the first laser array element and the second laser array element emit laser light in a third direction intersecting the first direction and a second direction to a processing target object while being relatively moved with respect to the processing target object in the second direction intersecting the first direction, a first end photonic crystal laser among the plurality of first photonic crystal lasers is located furthest in an opposite direction from the first direction among the plurality of first photonic crystal lasers, a second end photonic crystal laser among the plurality of first photonic crystal lasers is located furthest in the first direction among the plurality of first photonic crystal lasers, a first intermediate photonic crystal laser among the plurality of first photonic crystal lasers is located between the first end photonic crystal laser and the second end photonic crystal laser, a third end photonic crystal laser among the plurality of second photonic crystal lasers is located furthest in the opposite direction among the plurality of second photonic crystal lasers, a fourth end photonic crystal laser among the plurality of second photonic crystal lasers is located furthest in the first direction among the plurality of second photonic crystal lasers, a second intermediate photonic crystal laser among the plurality of second photonic crystal lasers is located between the third end photonic crystal laser and the fourth end photonic crystal laser, and when viewed from the second direction, the second end photonic crystal laser and the second intermediate photonic crystal laser overlap each other, the processing head is configured such that a region of the processing target object where the second end photonic crystal laser passes is laser-processed by not emitting laser light from the second end photonic crystal laser and by emitting laser light from the second intermediate photonic crystal laser.

* * * * *